United States Patent
Johnson

(10) Patent No.: US 7,147,507 B2
(45) Date of Patent: Dec. 12, 2006

(54) METER SOCKET SUPPORT BASE COUPLING ASSEMBLY

(75) Inventor: Jeffrey L. Johnson, Lincoln, IL (US)

(73) Assignee: Eaton Corporation, Cleveland, OH (US)

( * ) Notice: Subject to any disclaimer, the term of this patent is extended or adjusted under 35 U.S.C. 154(b) by 0 days.

(21) Appl. No.: 11/054,531

(22) Filed: Feb. 9, 2005

(65) Prior Publication Data
US 2006/0178043 A1     Aug. 10, 2006

(51) Int. Cl.
*H01R 33/945* (2006.01)

(52) U.S. Cl. ..................................... 439/517

(58) Field of Classification Search ............... 439/517, 439/508, 507, 509; 361/664, 659
See application file for complete search history.

(56) References Cited

U.S. PATENT DOCUMENTS

| | | | | |
|---|---|---|---|---|
| 2,142,013 A | * | 12/1938 | Willes | 361/668 |
| 2,592,299 A | * | 4/1952 | Lewis | 439/249 |
| 4,783,034 A | * | 11/1988 | Ostrander et al. | 248/221.12 |
| 6,362,952 B1 | | 3/2002 | Schoonover et al. | |
| 6,561,844 B1 | | 5/2003 | Johnson | |

* cited by examiner

*Primary Examiner*—Phuong Dinh
(74) *Attorney, Agent, or Firm*—Martin J. Moran

(57) ABSTRACT

A meter socket base coupling assembly that includes a base bracket having a planar member with a plurality of openings, the base bracket openings defining a retaining device first component, and at least one elongated, non-conductive base member coupled to the base bracket, the non-conductive base member having a body with an upper side and a lower side, the base member body lower side having a plurality of pins extending therefrom, the pins structured to align with, and pass through, the base bracket openings and having a retaining device second component.

3 Claims, 4 Drawing Sheets

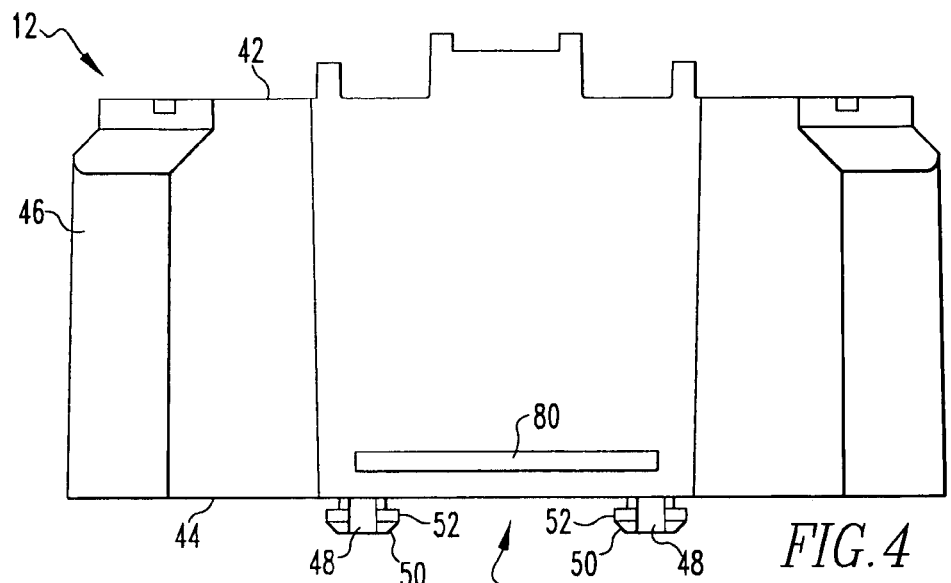
FIG.4
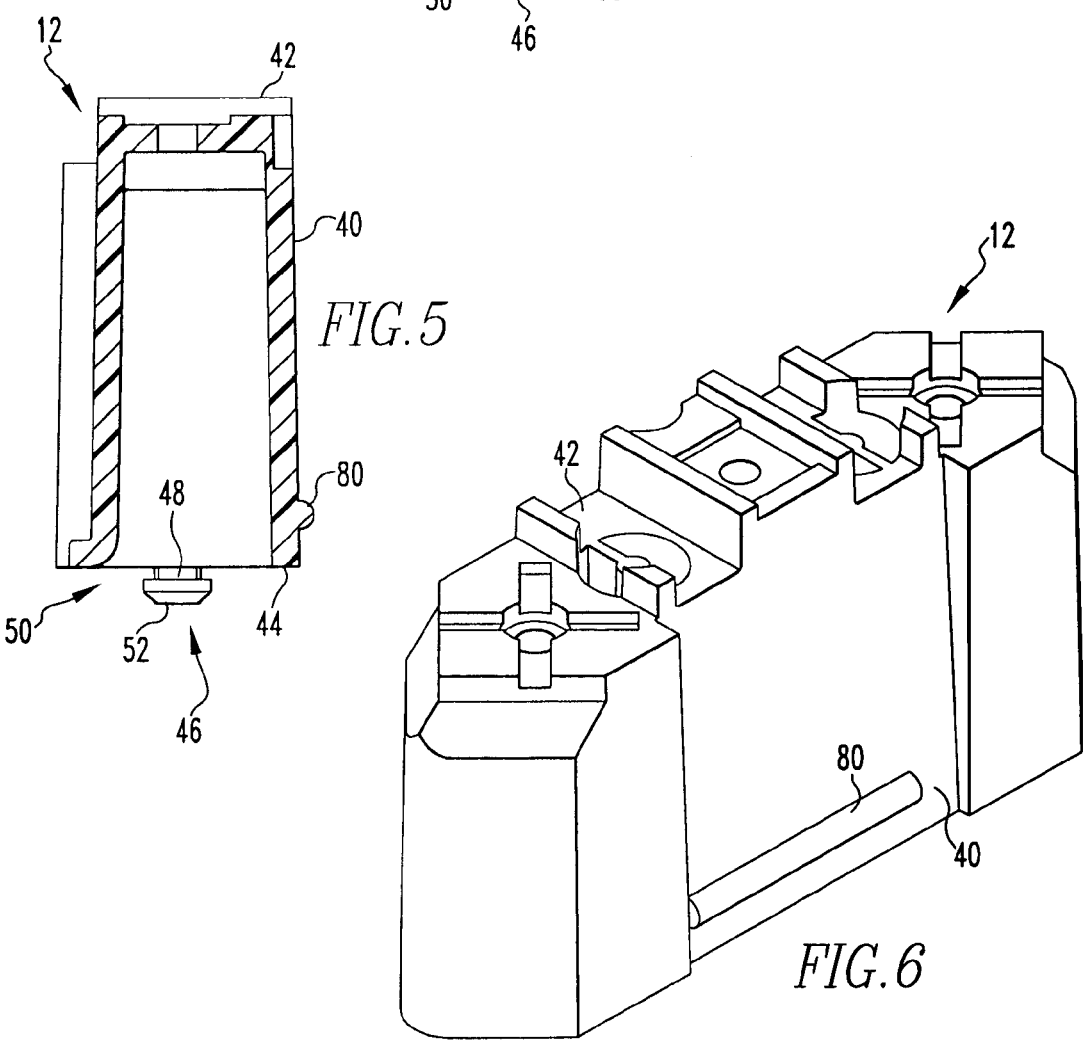
FIG.5
FIG.6

METER SOCKET SUPPORT BASE COUPLING ASSEMBLY

BACKGROUND OF THE INVENTION

1. Field of the Invention

The present invention relates to a meter socket and, more specifically, to a meter socket wherein the base member(s) is coupled to the support bracket without welds or threaded fasteners, or a reduced number of threaded fasteners.

2. Background Information

A meter for measuring the usage of electricity is coupled to a plurality of bus members or lines at a meter socket. The meter socket includes a non-conductive base member(s), a plurality of lugs structured to be coupled to the bus lines, a plurality of pincer-like jaw assemblies, and a base bracket. Typically, the base bracket was attached to a grounding/support structure. The non-conductive base was coupled to the base bracket. The lugs were coupled to the non-conductive base member(s) and the jaw assemblies were each coupled to a lug. Thus, each jaw assembly was in electrical communication with either the line or the load buses within the meter socket. The jaw assemblies face, that is, opened toward, the front of the meter socket. The meter typically included a cylindrical enclosure having a display on the front side, a metering device enclosed therein, and a plurality of conductive stabs extending from the back side. The stabs were structured to be coupled to the jaw assemblies thereby coupling the line and load buses through the meter. In this configuration, the metering device could collect data as to how much electricity flowed though the meter socket.

The meter socket was, typically, an assembly that included multiple components coupled by fasteners and/or plastic welding. For example, the non-conductive base member(s) were typically coupled to the base bracket by welding or threaded fasteners passing through the non-conductive base member(s). These coupling means, however, had disadvantages. The welding operation could result in foreign matter contaminating the weld area and weld spatter. The use of threaded fasteners increased the time and energy required to assemble a meter socket assembly. Thus, it would be advantageous to have a meter socket base wherein the non-conductive base could be coupled to the base bracket without welding and a reduced number of fasteners.

There is, therefore, a need for a meter socket base coupling assembly that couples the base member(s) to the base bracket without welding.

There is a further need for a meter socket base coupling assembly that couples the base member(s) to the base bracket with a reduced number of fasteners.

SUMMARY OF THE INVENTION

These needs, and others, are met by the present invention which provides for a meter socket base coupling assembly wherein the non-conductive base member(s) is coupled to the base bracket without welding or fasteners. Instead, the non-conductive base member(s) is coupled to the base bracket by a pin which is integral to, that is, part of the cast, non-conductive base member(s). The pin may have a head and shoulder configuration that is structured to engage a keyhole slot on the base bracket. Alternatively, the pins may be made of a soft material, such as a dielectric plastic, and the base bracket may be made from a rigid material, such as, but not limited to, metal, and the base bracket has openings with sharp edges. In this configuration, the soft pins are inserted through the base bracket openings, and the sharp edge of the base bracket openings engages, or digs into, the dielectric material.

Where there are two, spaced non-conductive base members, which is the preferred embodiment, the non-conductive base members may further be locked into place by a neutral lug. The neutral lug is made from a rigid material, such as, but not limited to, aluminum. The neutral lug further includes a lip on each side structured to engage the non-conductive base members. The neutral lug is disposed between the non-conductive base members and may be held in place by a snap-fit, or by a fastener coupled to the base bracket.

BRIEF DESCRIPTION OF THE DRAWINGS

A full understanding of the invention can be gained from the following description of the preferred embodiments when read in conjunction with the accompanying drawings in which:

FIG. 4 is a side view of a base member.

FIG. 5 is a cross-sectional view of a base member.

FIG. 6 is an isometric view of a base member.

DESCRIPTION OF THE PREFERRED EMBODIMENTS

As used herein, directional terms, such as "upper" and "lower" relate to the socket assembly as shown in the Figures and are not limiting upon the claims.

Figure 1:
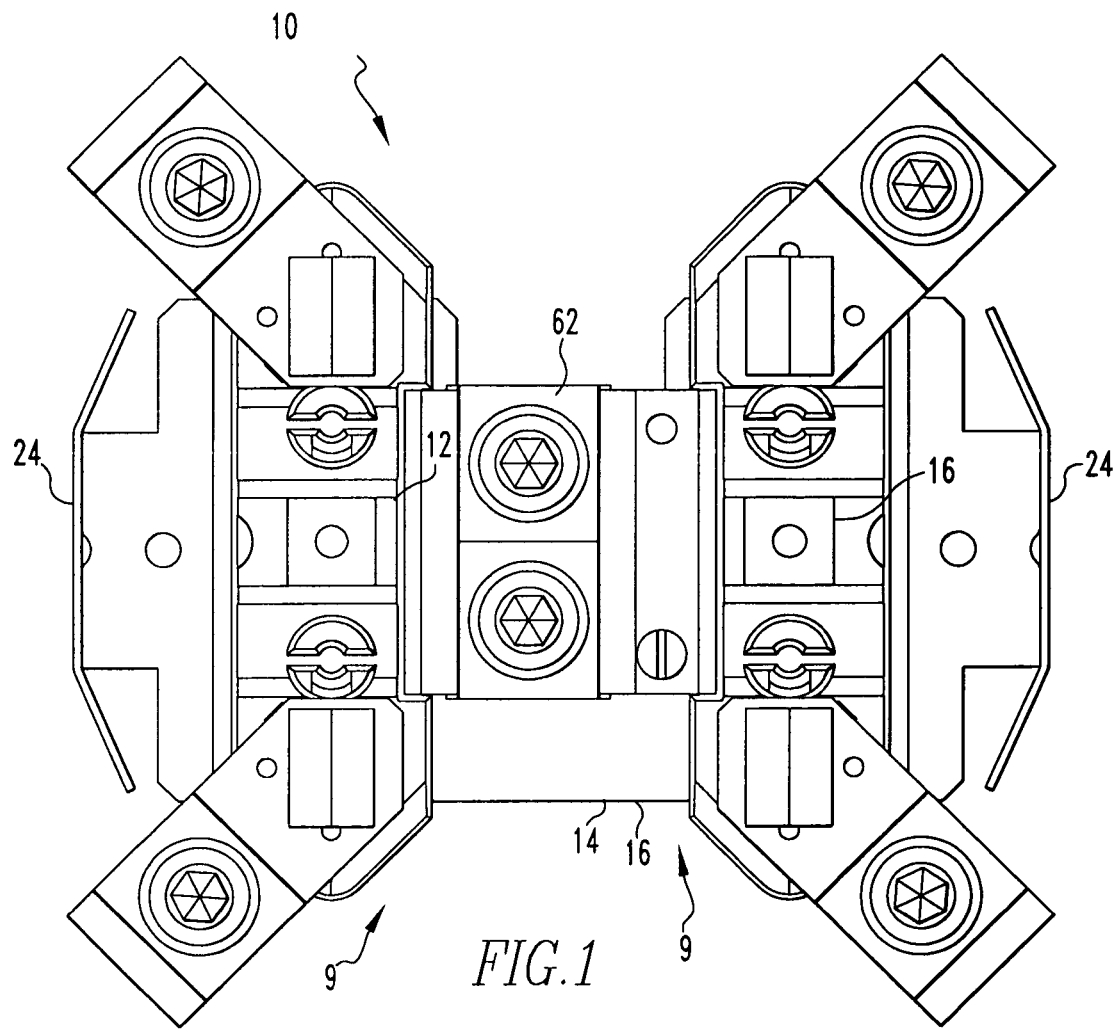
FIG. 1 is a top view of a socket base assembly.
Figure 1A:
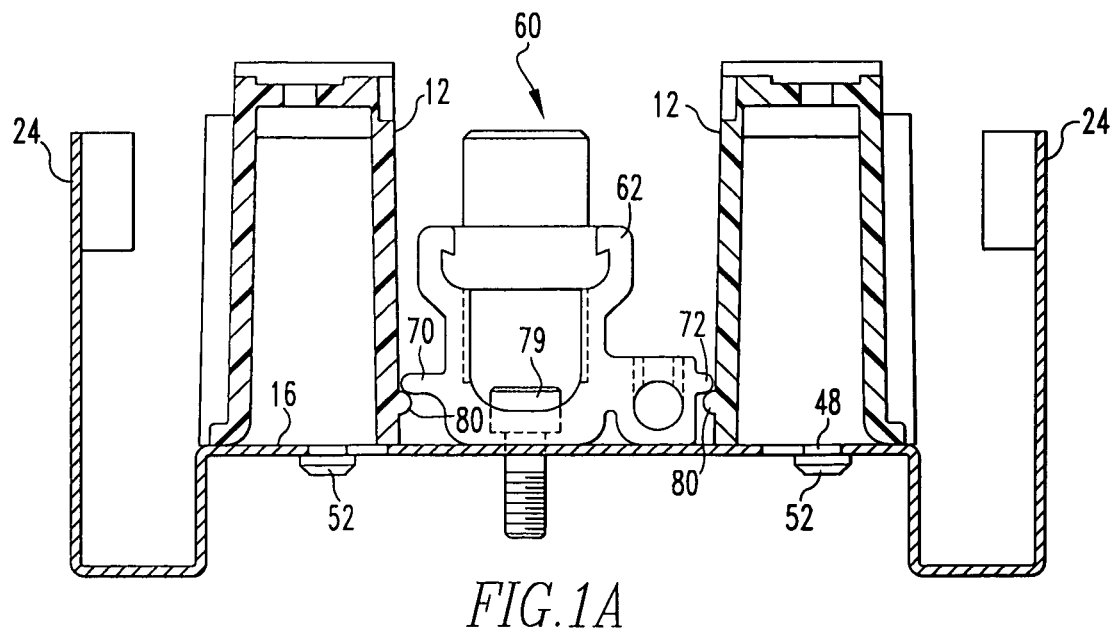
FIG. 1A is a detailed cross-sectional view of the meter socket.

As shown in FIG. 1, a meter socket base coupling assembly 10 is structured to couple a base member 12 to a base bracket 14 without the use of welding or more than two fasteners. The base member 12 and base bracket 14 are coupled to each other by a retaining device 9 having a first component 32 and a second component 50, both discussed below.

Figure 2:
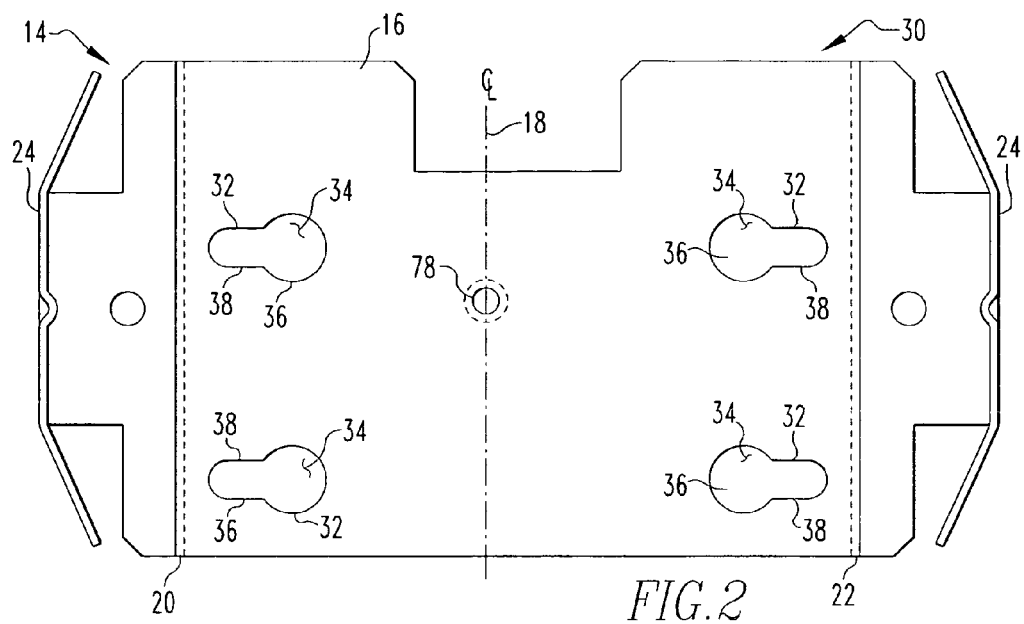
FIG. 2 is a top view of a base bracket.
Figure 3:
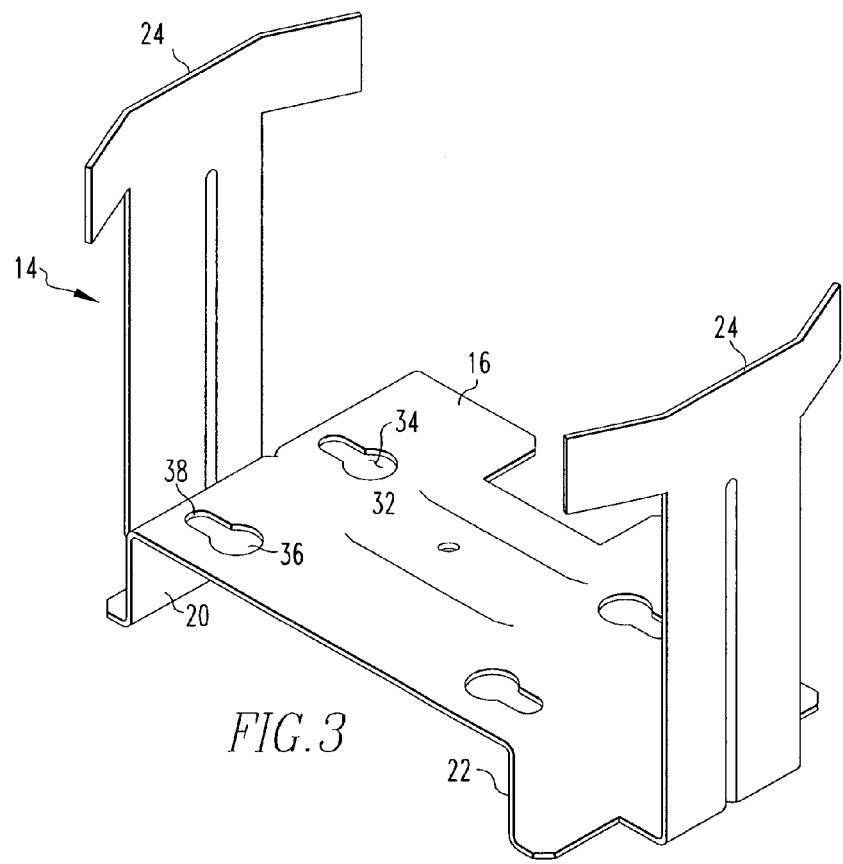
FIG. 3 is an isometric view of a base bracket.

As shown in FIGS. 2 and 3, the base bracket 14 includes a planar member 16 having a centerline 18, and two support legs 20, 22, one each on opposite sides of the planar member 16. The base bracket 14 may include guide structures 24 coupled to the support legs 20, 22. The guide structures 24 are not required for the meter socket base coupling assembly 10 to function. The guide structures 24 are disposed on either side of the base bracket 14 and assist a user in inserting a meter assembly (not shown) into the meter socket.

The planar member 16 include a plurality 29 of openings 30 defining a retaining device first component 32. The retaining device first component 32 is, preferably, a keyed slot 34. That is, a slot having a wide portion 36 and a narrow portion 38. The keyed slots 34 are preferably disposed in a generally rectangular pattern. In the preferred embodiment, each keyed slot wide portion 36 is disposed closer to the centerline 1 8 than the keyed slot narrow portion 38. As described below, this creates a locking feature. While the keyed slots 34 are shown with a longitudinal axis being generally perpendicular to the centerline 18, the longitudinal axis of the keyed slots 34 may be at any angle relative to the centerline 18, including parallel to the centerline 1 8.

As shown on FIGS. 4–6, the base member 12, or preferably two separate base members 12, a first and second non-conductive base member 12, disposed on the base bracket 14 in a spaced and generally parallel relationship, include an elongated body 40 having an upper side 42 and a lower side 44. The base member body lower side 44 includes a plurality 46 of pins 48 that define a retaining device second component 50. Each pin 48 in the plurality 46 of pins is structured to align with an opening 30 in the plurality 29 of openings on the base bracket 14. Additionally, each pin 48 has a cross-sectional area that has a width approximately the same as the width of the keyed slot narrow portion 38. In the preferred embodiment, the retaining device second component 50 is a head 52 on each pin 48. The pin head 52 is structured to have a greater cross-sectional area than the pin 48, but smaller than the cross-sectional area of the keyed slot wide portion 36. Thus, each pin head 52 may pass through a keyed slot wide portion 36 and the pin 48 may be moved into the keyed slot narrow portion 38. In this configuration, the base members 12 may not be moved away from the base bracket 14 in a normal direction without first sliding the pin head 52 back into alignment with the associated keyed slot wide portion 36.

Figure 7:
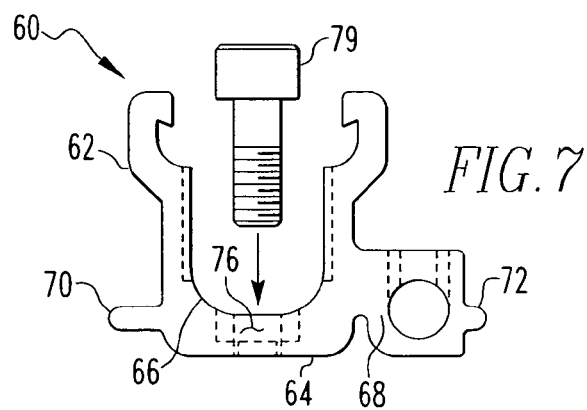
FIG. 7 is a cross-sectional view of a neutral lug.
Figure 8:
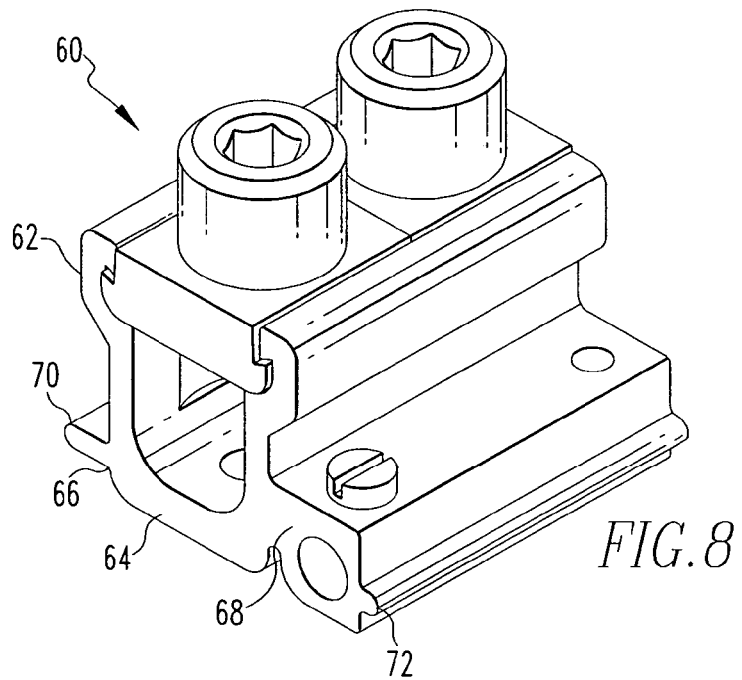
FIG. 8 is an isometric view of a neutral lug.

In a more preferred embodiment, the keyed slots 34 are positioned with the wide portions 36 closer to the centerline 18 than the narrow portions 38. Thus, to install two base members 12, the base members 12 are moved away from each other on the base bracket 14. The base members 12 may be locked in place through the addition of a rigid member 60 disposed therebetween. As shown in FIGS. 7 and 8, the rigid member 60 is preferably a neutral lug 62. The neutral lug 62 includes a rigid body 64 having a first side 66 and a second side 68. Each lug body side 66, 68 includes a lateral ridge 70, 72 respectively. Each lateral ridge 70, 72 is structured to engage a base member 12. The base member 12 may include a corresponding ridge 80. When the base member 12 is installed on a base bracket 14, the base member ridge 80 creates a snap-fit lock for the neutral lug 62. Alternatively, the neutral lug 62 may include a fastener opening 76 and the base bracket 14 may include a corresponding fastener opening 78 (FIG. 1) whereby a fastener 79 may be used to fix the neutral lug 62 to the base bracket 14.

Figure 9:
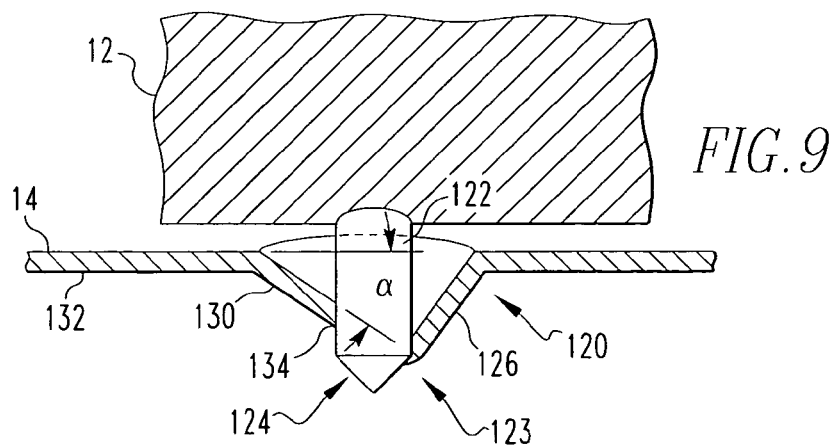
FIG. 9 is a cross-sectional view of an alternate embodiment.

As shown in FIG. 9, an alternate embodiment a meter socket base coupling assembly 110 includes a retaining device 109 having a different first component and a second components. That is, instead of a pin 48 with a head 52 cooperating with a keyed slot 34, the first component 120 is an elongated soft pin 122 and the second component 123 is an opening 124 in a conical depression 126 with a sharp edge 128. Generally, the other components of the alternate embodiment, e.g., the bracket planar member 16, are identical and will be referred to using the reference numbers identified above. Thus, as shown in FIG. 9, the base bracket openings 124 are formed as a conical depression 126 having a sidewall 130 extending from the base bracket back side 132. The sidewall 130 terminates in a back edge 134. The back edge 132 may be sharp. The back edge 134 forms a plane which is not parallel to the plane of bracket planar member 16. As represented by angle a, preferably the back edge 134 is angled from about 408 to 508, and more preferably about 458, from the plane of bracket planar member 16. The maximum diameter of the conical depression 126 is about 0.50 inch. The base members 12 are made from a dielectric material, preferably a plastic, which is softer than the base bracket 14 material. Additionally, the pins 122 have an extended length to accommodate the depth of the conical depression 126. In this configuration, the base members 12 may be attached to base bracket 14 by pressing mounting pins 122 through openings 124. When mounting pins 122 are inserted through mounting openings 124 and an attempt to withdraw base members 12 is made, back edge 134 engages, or digs into, the plastic material of mounting pins 122 thereby resisting the removal of mounting pins 122 from openings 124.

While specific embodiments of the invention have been described in detail, it will be appreciated by those skilled in the art that various modifications and alternatives to those details could be developed in light of the overall teachings of the disclosure. Accordingly, the particular arrangements disclosed are meant to be illustrative only and not limiting as to the scope of invention which is to be given the full breadth of the claims appended and any and all equivalents thereof.

What is claimed is:

1. A meter socket base coupling assembly comprising:
   a base bracket having a planar member with a plurality of openings, said base bracket openings defining a retaining device first component; and
   at least one elongated, non-conductive base member coupled to said base bracket, said non-conductive base member having a body with an upper side and a lower side, said base member body lower side having a plurality of pins extending therefrom, said pins structured to align with, and pass through, said base bracket openings and having a retaining device second component wherein said retaining device first component includes a keyed slot at each said base bracket opening, each said keyed slot having a wide portion and a narrow portion; and said retaining device second component includes heads on each said pin, said pin head having a greater cross-sectional area than said pin; and wherein each said pin head may pass through said wide portion and wherein said pin may be moved into said narrow portion.

2. The meter socket base coupling assembly of claim 1 wherein said at least one elongated, non-conductive base member includes a first and second elongated, non-conductive base members, said first and second non-conductive base members disposed on said base bracket in a spaced and generally parallel relationship.

3. The meter socket base coupling assembly of claim 1 wherein:
   said base bracket having a planar member has a centerline, said first and second base members disposed on opposite side of said centerline; and
   the longitudinal axis of each keyed slot is generally perpendicular to said centerline with each said wide portion being disposed closer to said centerline than each narrow portion.

* * * * *